US 6,970,160 B2
Nov. 29, 2005

(12) United States Patent
Mulligan et al.

(54) LATTICE TOUCH-SENSING SYSTEM

(75) Inventors: Roger C. Mulligan, White Rock (CA);
Massoud Badaye, Vancouver (CA);
Alex K. Wong, Vancouver (CA); Brian G. Lim, Vancouver (CA)

(73) Assignee: 3M Innovative Properties Company, St. Paul, MN (US)

( * ) Notice: Subject to any disclaimer, the term of this patent is extended or adjusted under 35 U.S.C. 154(b) by 190 days.

(21) Appl. No.: 10/324,728

(22) Filed: Dec. 19, 2002

(65) Prior Publication Data

US 2004/0119701 A1 Jun. 24, 2004

(51) Int. Cl.[7] .............................................. G09G 5/00
(52) U.S. Cl. ...................................... 345/173; 345/174
(58) Field of Search ............................... 345/173–179, 345/156, 1, 2, 903, 126, 169, 184, 158; 178/18.01–18.09, 178/19.01–19.03, 20.01

(56) References Cited

U.S. PATENT DOCUMENTS

| | | | |
|---|---|---|---|
| 4,686,332 A | | 8/1987 | Greanias et al. |
| 5,015,072 A | | 5/1991 | Howell |
| 5,650,597 A | * | 7/1997 | Redmayne ............... 178/18.06 |
| 5,844,506 A | | 12/1998 | Binstead |
| 5,880,411 A | * | 3/1999 | Gillespie et al. ......... 178/18.01 |
| 6,137,427 A | | 10/2000 | Binstead |
| 6,163,313 A | * | 12/2000 | Aroyan et al. ............... 345/173 |
| 6,297,811 B1 | | 10/2001 | Kent et al. |
| 6,825,833 B2 | * | 11/2004 | Mulligan et al. ........... 345/174 |
| 2003/0213624 A1 | * | 11/2003 | Cross et al. ............... 178/18.06 |
| 2003/0234771 A1 | * | 12/2003 | Mulligan et al. ........... 345/174 |
| 2004/0178997 A1 | * | 9/2004 | Gillespie et al. ............ 345/173 |
| 2004/0183787 A1 | * | 9/2004 | Geaghan et al. ............ 345/173 |

FOREIGN PATENT DOCUMENTS

| | | |
|---|---|---|
| EP | 0 495 199 A2 | 7/1992 |
| EP | 0 495 199 A3 | 7/1992 |
| JP | 3-11514 | 1/1991 |
| JP | 5-127822 | 5/1993 |

(Continued)

OTHER PUBLICATIONS

U.S. Appl. No. 09/998,614, filed Nov. 30, 2001, System and Method for Locating a Touch on a Capacitive Touch Screen.

(Continued)

Primary Examiner—Vijay Shankar
Assistant Examiner—Prabodh Dharia
(74) Attorney, Agent, or Firm—Robert J. Pechman (57) ABSTRACT

This invention is directed to a lattice touch-sensing system for detecting a position of a touch on a touch-sensitive surface. The lattice touch-sensing system may include two capacitive sensing layers, separated by an insulating material, where each layer consists of substantially parallel conducting elements, and the conducting elements of the two sensing layers are substantially orthogonal to each other. Each element may comprise a series of diamond shaped patches that are connected together with narrow conductive rectangular strips. Each conducting element of a given sensing layer is electrically connected at one or both ends to a lead line of a corresponding set of lead lines. A control circuit may also be included to provide an excitation signal to both sets of conducting elements through the corresponding sets of lead lines, to receive sensing signals generated by sensor elements when a touch on the surface occurs, and to determine a position of the touch based on the position of the affected bars in each layer.

22 Claims, 6 Drawing Sheets

FOREIGN PATENT DOCUMENTS

| | | |
|---|---|---|
| JP | 11-531118 | 2/1999 |
| JP | 11-142836 | 5/1999 |
| WO | WO 99/53432 | 10/1999 |
| JP | 9-185328 | 7/1997 |
| JP | 10-69355 | 3/1998 |
| JP | 10-161109 | 6/1998 |
| JP | 10-301099 | 11/1998 |

OTHER PUBLICATIONS

U.S. Appl. No. 10/176,564, filed Jun. 21, 2002, Capacitive Touch Sensor Architecture with Unique Sensor Bar Addressing.

* cited by examiner

LATTICE TOUCH-SENSING SYSTEM

FIELD OF INVENTION

The present invention relates to a lattice touch-sensing system. More particularly, the present invention relates to a touch-sensing system with a touch-sensitive surface that includes sensor bars laid out in a lattice.

BACKGROUND OF THE INVENTION

As computers and other electronic devices become more ubiquitous, touch-sensing systems are becoming more prevalent as a means for inputting data. For example, touch-sensing systems may now be found in workshops, warehouses, manufacturing facilities, restaurants, on hand-held personal digital assistants, automatic teller machines, casino game-machines, and the like.

Capacitive touch sensing is one of the most widely used techniques in touch screen industries. Capacitive touch sensors are mainly divided in two groups, namely, the continuous capacitive sensors, and discontinuous (patterned) capacitive sensors. In a continuous capacitive sensor, the sensor consists of a sheet of conducting thin film that is excited from four corners. The signals induced by a touch are transmitted from the corners to a controller, where they are decoded and translated to coordinates. In a typical patterned capacitive touch screen the sensor consists of a series of parallel conductive bars that are driven from both ends with an excitation signal from the controller. The signals induced by a touch are transmitted to the controller with the same lead lines that excite the sensor bars. These signals are then decoded in the controller and the touch coordinates are reported to a computer. For examples of this type of sensor refer to U.S. Pat. No. 5,650,597, and U.S. patent application Ser. No. 10/176,564.

In patterned capacitive screens different methods are used to calculate the touch coordinates. For example, in capacitive screens using near field imaging (NFI) the coordinate along the parallel bars, the X-axis, is determined by ratio of the voltage drops on left and right of the touch. The coordinate in the direction perpendicular to the bars, the Y-axis, is determined by finding the location of the touched bar combined by interpolation methods.

Touch sensors utilizing more than one patterned sensing layer can be used to determine the coordinates of a touch with high accuracy in both directions, provided that the sensing layers have the proper pattern geometry. Examples of multi-layered capacitive touch sensors are U.S. Pat. No. 4,686,332, and U.S. Pat. No. 6,137,427. The challenge of capacitively coupling to more than one sensing layer has forced the designers either to use very narrow conducting bars, or to use bars with vastly different widths on the two layers. The former design suffers from a very low signal level, and the latter design has significant error due to sparse distribution of the bars.

SUMMARY OF THE INVENTION

This invention is directed to a touch-sensing system for detecting a position of a touch on a touch-sensitive surface. The touch-sensing system comprises at least two layers of unidirectional capacitive sensor bars where each sensor bar is electrically connected at one or both ends to a lead line. According to one example, the other end of the sensor bar may be left open, which enables the area on that side of the touch sensor to be as small as possible. In another example, one or more layers may be connected at both ends so that weaker touches or multiple touches may be sensed. The sensor bars of the layers are disposed in a lattice configuration such that the sensor bars of one layer are disposed in a different direction from the sensor bars of the other layer. A touch on the touch-sensing system is located in one direction by signals from one layer of sensor bars, and in another direction by signals from the other layer of sensor bars.

In one aspect of the invention, the lattice touch-sensing system includes a surface and a lattice touch-sensing circuit. The sensing circuit comprises two sets of parallel and unidirectional capacitive sensor bars where the sensor bars of the first set are not parallel to the sensor bars of the second set. Each sensor bar of a given set of sensor bars is electrically connected to a lead line of a corresponding set of lead lines.

In another aspect of the invention, the lattice touch-sensing system includes a surface, a lattice touch-sensing circuit with two sets of parallel and unidirectional capacitive sensor bars and two corresponding sets of lead lines, and a control circuit. The control circuit provides an excitation signal to both set of sensor bars through the corresponding set of lead lines, receives sensing signals produced when a touch on the surface occurs, and determines the position of the touch from the sensing signals.

In yet another aspect of the invention, the lattice touch-sensing system includes a touch pane, two sensor planes separated by a sheet of dielectric material, and a control circuit. Each of the two sensor planes includes parallel and unidirectional capacitive sensor bars, which are electrically connected to corresponding lead lines. The lead lines are electrically connected to the control circuit, which provides an excitation signal to the sensor bars through the lead lines, receives sensing signals produced when a touch on the surface occurs, and determines a position of the touch from the sensing signals.

In still another aspect of the invention, the lattice touch-sensing system includes a touch surface and a lattice touch-sensing circuit. The sensing circuit includes two layers of unidirectional capacitive sensor bars where the sensor bars of the first layer are not parallel to the sensor bars of the second layer. More than one sensor bar of a given layer of the touch-sensing circuit is electrically connected to the same lead line of a corresponding set of lead lines. A signal-processing scheme is then used to distinguish which of the sensor bars experience the touch.

In still another aspect of the invention, the lattice touch-sensing system includes a touch surface and a lattice touch-sensing circuit. The sensing circuit includes two layers of unidirectional capacitive sensor bars where the sensor bars of the first layer are not parallel to the sensor bars of the second layer. Each sensor bar of one or both layers of the touch-sensing circuit is electrically connected at both ends to a lead line, wherein the resultant touch sensing system has improved multiple-touch recognition and/or rejection characteristics over a similar single-ended system.

DETAILED DESCRIPTION OF THE PREFERRED EMBODIMENT

The invention enables a touch-sensing system capable of detecting a position of a touch on a touch-sensitive surface. The touch-sensing system enabled by the invention includes a first layer of sensor bars arranged in a first direction, and a second layer of sensor bars arranged in a second direction. The first and second directions may be substantially orthogonal to each other. In this configuration, a touch to the touch-sensitive surface creates a signal on at least one sensor bar in each layer. The position of the touch is then determined by locating the touch on each of the two sensor bars. The first layer of sensor bars is used to identify the location of a touch along one axis, and the second layer of sensor bars is used to identify the touch location along another axis.

In one embodiment, the invention is implemented in a touch-sensitive screen in which multiple sensor bars arranged in a lattice configuration are embedded in the screen. Each of the sensor bars is electrically connected at least at one end to a lead line. The particulars of this invention will become apparent from the following detailed discussion of embodiments of the invention.

Figure 1:
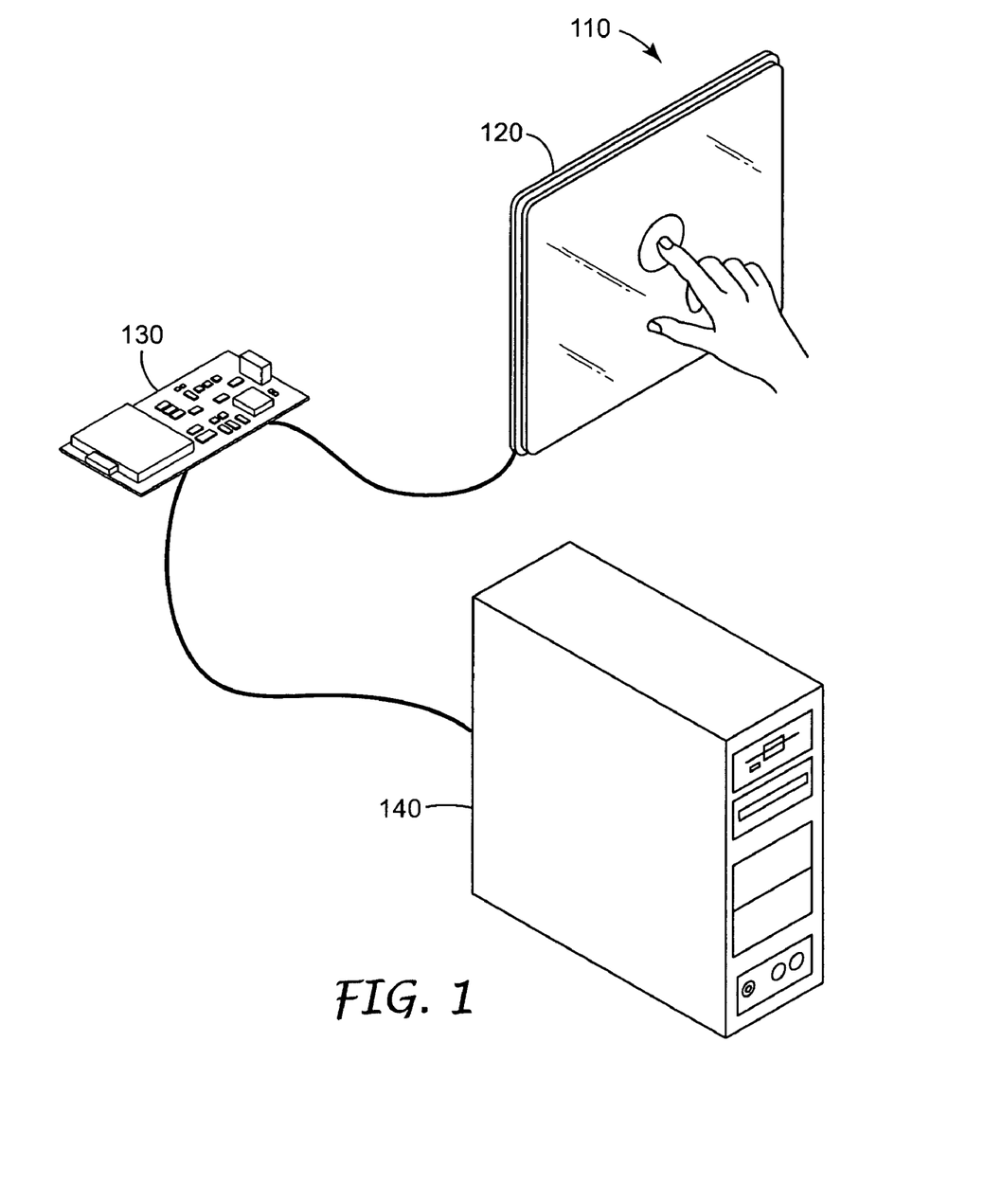
FIG. 1 is a schematic representation of one embodiment of a touch-sensing system.

FIG. 1 is a schematic representation of one implementation of the present invention, showing an exemplary touch-sensing system 110 that includes a touch-sensitive screen 120, a control circuit 130, and a computer 140. In operation, the touch-sensing screen 120 generates signals in response to a touch on the screen. The signals are transmitted to the control circuit 130, which processes the signals. The control circuit 130 then transmits the results from processing the signals to computer 140 for further processing.

Touch-sensitive screen 120 is a capacitive touch screen that generates signals when it is touched. The components of touch-sensitive screen 120 will be discussed in detail in conjunction with FIG. 2. Briefly stated, touch-sensitive screen 120 has two layers of capacitive sensor bars. Each sensor bar in each layer is connected to a lead line at least at one end.

Control circuit 130 is a circuit that provides excitation current to the capacitive sensor bars in touch-sensitive screen 120. Control circuit 130 also detects and processes signals generated by the capacitive sensor bars. While driving and sensing signals on one layer, the control circuit 130 could put the other layer in any appropriate state, such as float the other layer or drive the other layer with a known signal or guard signal. Control circuit 130 may be of any type of electronic circuit, such as an integrated circuit. Control circuit 130 may be installed by itself or integrated into a computer, such as computer 140.

Figure 2:
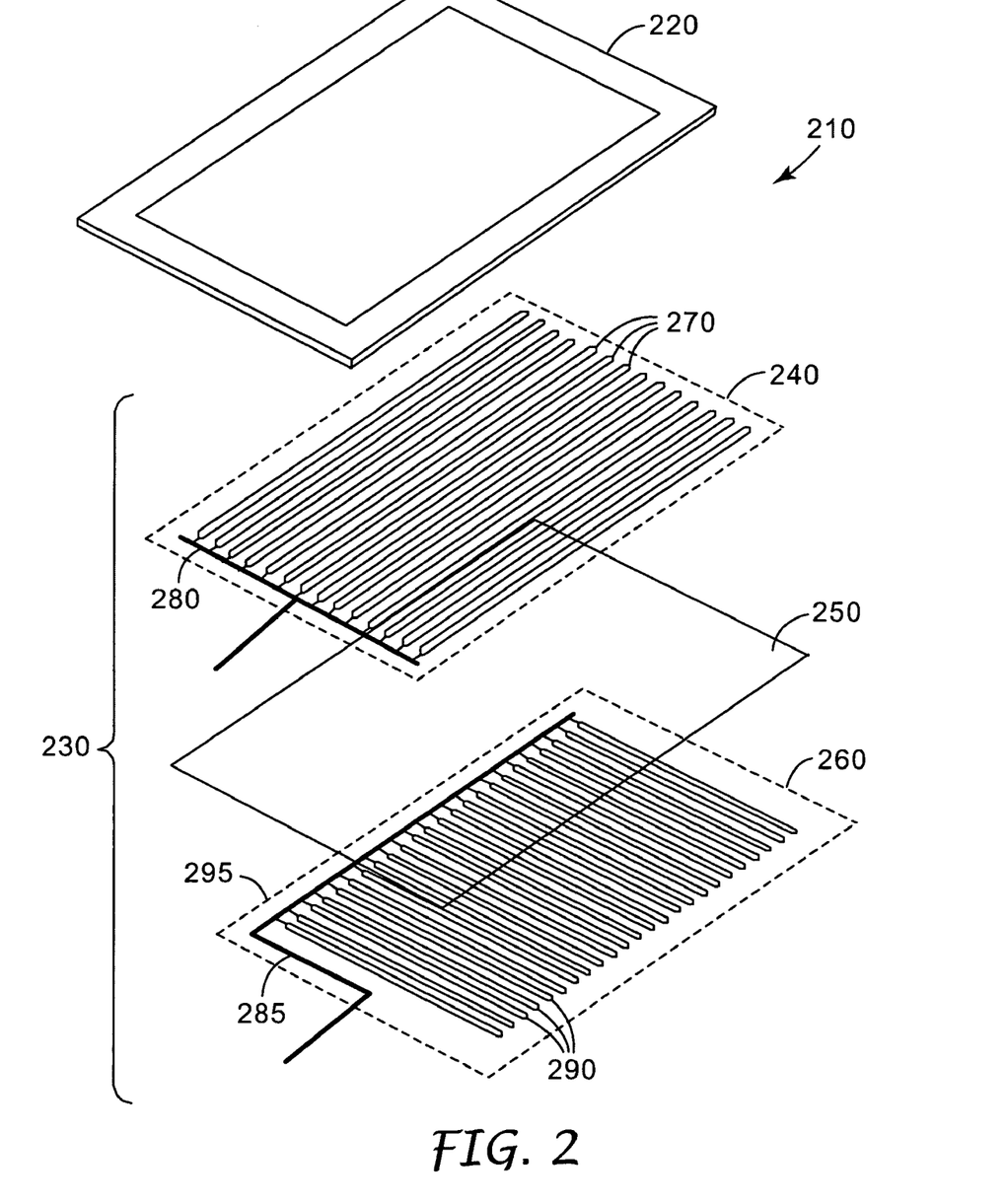
FIG. 2 is an exploded view of an embodiment of a touch-sensitive screen.

FIG. 2 is an exploded view of an exemplary embodiment of touch-sensitive screen 210. FIG. 2 only illustrates the principle components in touch-sensitive screen 210. Other components may be added without deviating from the principles of the invention.

Touch-sensitive screen 210 is made up of a series of layers laminated together. In this embodiment, touch-sensitive screen 210 includes a touch pane 220 and a lattice touch-sensing element 230. The lattice touch-sensing element 230 includes a first sensor layer 240, a second sensor layer 260, and an intermediate dielectric layer 250 disposed between the first sensor layer 240 and the second sensor layer 260.

The touch pane 220 is the uppermost layer of the touch-sensitive screen 210. The touch pane 220 may be made of an optically clear substance. The touch pane 220 may be manufactured from a chemically strengthened glass, transparent plastic, or any other acceptable dielectric material. One side of the touch pane 220 serves as the touch surface of the touch-sensitive screen 210, while the other side of the touch pane 220 is attached to the lattice touch-sensing element 230. The touch pane 220 provides the necessary dielectric material between the touching object and the sensing element, as well as protecting the touch-sensing element 230 from environmental hazards.

The top layer of the lattice touch-sensing element 230 is the first sensor layer 240. The first sensor layer 240 includes a plurality of capacitive touch-sensitive sensor bars 270 arranged substantially parallel to each other in a unidirectional manner. They are preferably constructed of indium tin oxide (ITO) for optical transparency, but may be constructed of any conductive transparent material for transparent applications, such as other transparent conductive oxides as well as transparent conductive polymers. Alternatively, the sensor bars may be constructed from conductive non-transparent material for applications that do not require transparency.

The second sensor layer 260 also includes a plurality of capacitive touch-sensitive sensor bars 290 arranged substantially parallel to each other in a unidirectional manner. The sensor layers 240 and 260 are parallel to each other with the sensor bars 290 of the second sensor layer 260 being oriented substantially orthogonal to the sensor bars 270 of the first sensor layer 240. As used herein, the terms "orthogonal" or "perpendicular" shall have their ordinary meanings but that the elements referred to as orthogonal or perpendicular do not actually intersect because they lie in different planes. The term intersection shall be used to mean an intersection of bars when projected onto an imaginary plane parallel to the touch sensing planes 240 and 260, even though the bars do not actually join.

In accordance with the invention, one end of each first-layer sensor bar 270 is electrically connected to one end of a corresponding lead line in a plurality of lead lines 280. Likewise, one end of each second-layer sensor bar 290 is connected to one end of a corresponding lead line in a plurality of lead lines 285. The other ends of the lead lines 280/285 are coupled to a control circuit 130 (FIG. 1). The lead lines 280/285 are electrical conduits that allow signals to travel between control circuit 130 and sensor bars 270/290. The lead lines 280/285 are illustrated in FIG. 2 as a single line for simplicity of illustration only. It should be appreciated that each lead line may individually extend from the sensor bars 279/290 to the control circuit 130, or that more than one sensor bar 270/290 may be connected to the same lead line 280/290 if an alternative addressing mechanism is used to uniquely identify each sensor bar on a particular layer. Lead lines 280 may be made of any conductive material, such as copper, silver, gold, or the like.

The dielectric layer 250 is a non-conductive layer that separates the first sensor layer 240 and the second sensor layer 260. The dielectric layer 250 may be an adhesive manufactured from any non-conductive, transparent material. The dielectric layer 250 serves as electrical insulator, which prevents sensor bars 270 of the first sensor layer 240 and sensor bars 290 of the second sensor layer 260 from coming into direct contact.

Figure 3:
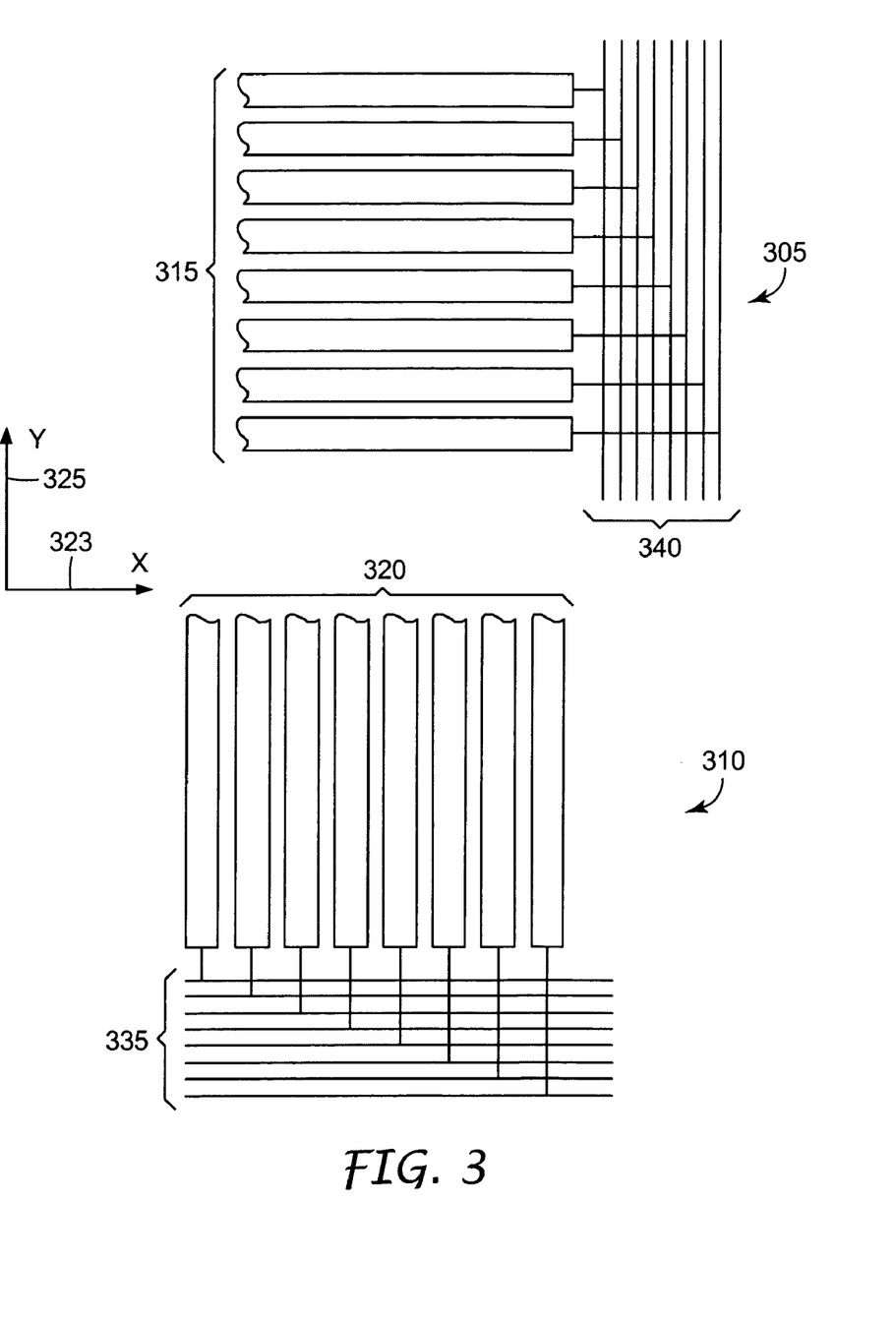
FIG. 3 is a schematic representation of portions of two simplified sensor layers.
Figure 4:
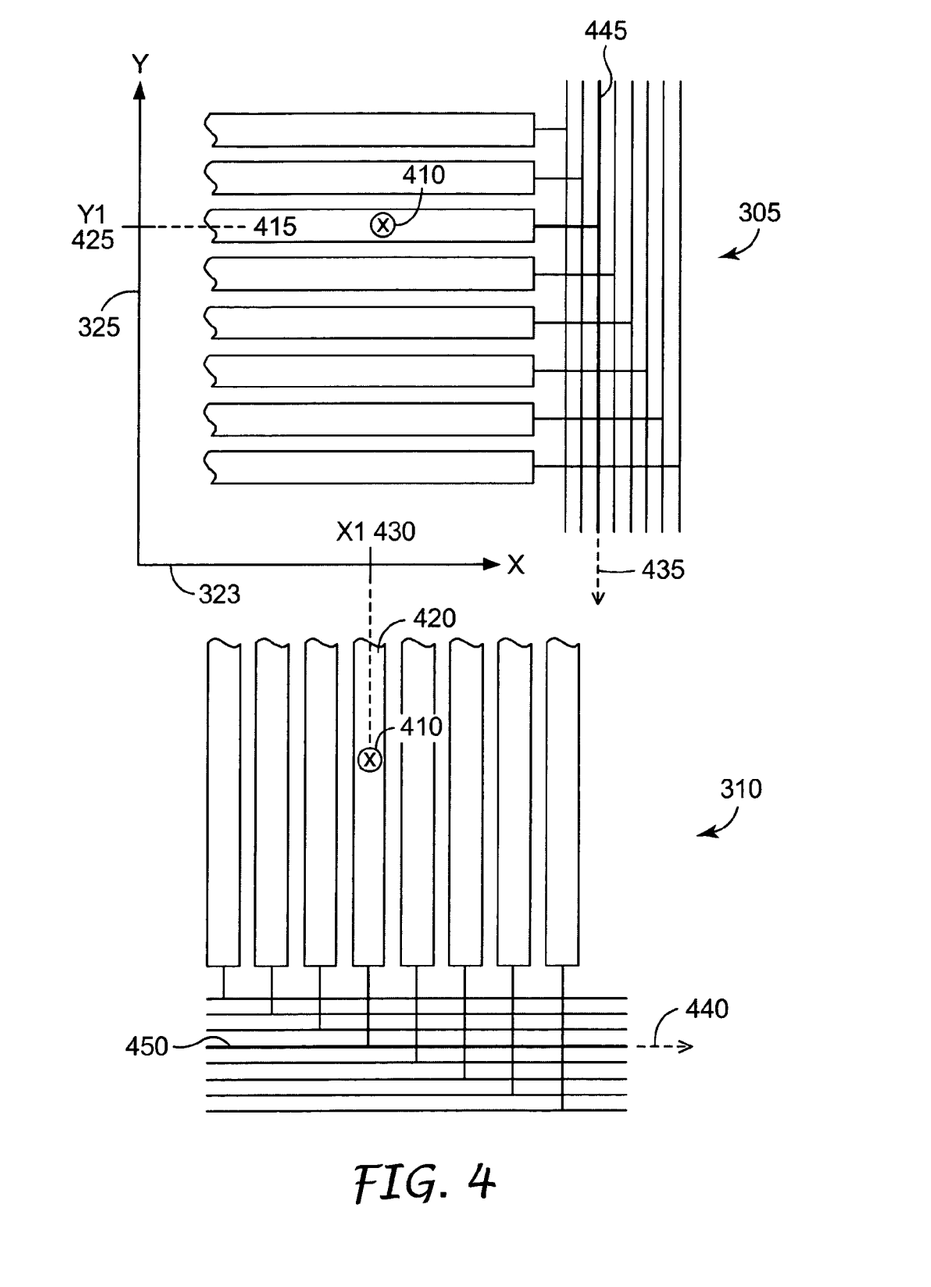
FIG. 4 is a schematic representation of two simplified operational sensing layers responding to a touch.

Briefly stated here, and described in greater detail in conjunction with FIGS. 3 and 4, the sensor bars 270/290 receive an excitation signal via the lead lines 280/285 from the control circuit 130. The excitation signal sets up an electric field on each sensor bar 270/290. A touch to the touch-sensitive screen 210 results in a capacitive coupling between the touching object and the sensor bars 270/290 of both layers in the area proximate to the touch. The capacitive coupling between the touching object and the sensor bars near the touch causes an AC current to flow from the controller via the lead lines through the coupled sensor bars to ground. Since the magnitude of the current on each lead line depends on the extent of the coupling of the touching object with the bar (or bars) connected to that lead line, the controller can accurately determine the touched bars on each sensing layer by determining which bar on each sensor layer has the highest signal. The touch position on each layer may be further refined by also examining the strength of the signals on the lead lines connected to the bars in the immediate neighborhood of the sensor bars having the highest signal. The inventors have determined that interpolating between two or more strong signals on each sensing layer can improve the accuracy of the coordinate determination. The signals from each sensing layer determine the touch position along an axis perpendicular to the bars in that layer. Since the bars on the two sensing layers are perpendicular to each other the axes on which the touch position are calculated are also perpendicular to each other. Therefore, the touch position is uniquely determined by knowing the touch coordinates on the two orthogonal axes.

FIG. 2 illustrates an exemplary touch-sensitive screen 215 in which only one end of first-layer sensor bar 270 is electrically connected to one end of a corresponding lead line in a plurality of lead lines 280, and one end of each second-layer sensor bar 290 is connected to one end of a corresponding lead line in a plurality of lead lines 285. In an alternative example, either first-layer sensor bar 270, second-layer sensor bar 290, or both, could be electrically connected at both ends. With both ends of one or both sensor bars electrically connected, extra information can be obtained. For example, electrically connecting both ends of the sensor bars could be used for greater resolution. Alternatively, electrically connecting to both ends of the sensor bars could be used for the recognition of multiple touches. Recognition of multiple touches could be used in a gaming application, for example. In another alternative, electrically connecting both ends of the sensor bar could be used in the rejection of multiple touches.

FIG. 3 is a simplified schematic representation of one embodiment of sensor bars 315 in a first layer 305 and sensor bars 320 in a second layer 310 of a touch-sensitive screen, configured as described in conjunction with FIG. 2, to further illustrate the concepts of this invention. In this implementation, the sensor bars 315 of the first layer 305 and the sensor bars 320 of the second layer 310 are oriented substantially orthogonal to each other. Other orientations may be used without deviating from the principles of the invention. To facilitate discussion, the sensor bars 315 of the first layer 305 are parallel to an arbitrarily drawn X-axis 323. The sensor bars 320 of the second layer 310 are parallel to an arbitrarily drawn Y-axis 325.

Each of the sensor bars 315 and sensor bars 320 has one end electrically connected to corresponding lead lines 330 and lead line 335, respectively. In the example illustrated in FIG. 3, sensor bars 315 and sensor bars 320 may or may not be electrically connected at the other end. Lead lines 330 and lead lines 335 may be connected to a control circuit, such as the control circuit 130 shown in FIG. 1. It should be appreciated that the number of lead lines on each layer is always less than or equal to the number of sensor bars on that layer.

When in operation, the control circuit 130 sets up an electric potential on sensor bars 315 and sensor bars 320 via the corresponding lead lines 330 and 335. The excitation signal electrically energizes sensor bars 315 and sensor bars 320. The excitation of the sensing layers may be simultaneous or sequential. In another embodiment, the sensing bars of each layer may be excited one at a time, while the sensing bars of the other layer are kept at a fixed potential or driven with some other signal, such as a guard signal.

FIG. 3 illustrates an example in which the sensor bars of each layer are electrically connected at one end. However, in another embodiment, the sensor bars of one or both layers may be electrically connected at both ends. Having the sensor bars connected at both ends in one or both layers provides certain benefits over the single-ended embodiments. Each sensor layer could provide more detailed information, including the touch location in both directions. This extra information could greatly improve multiple touch rejection, or, conversely, to enable multiple touch recognition. For instance, a two-layer touch sensor could be used in combination with a gaming application that allowed two players to simultaneously touch the touch sensor. In addition, the improved performance of a dual-layer double-end-connected design would allow weaker signals to be accurately detected, such as those experienced by users wearing gloves or the like. These and other advantages and applications will be apparent to those skilled in the art.

FIG. 4 is a simplified schematic representation of the touch-sensitive screen of FIG. 3 in operation responding to a touch. To illustrate the principles of this invention, assume that a user touches a touch-sensitive screen with an object or a finger at position 410, which is experienced by both sensor bar 415 and sensor bar 420. As shown in FIG. 4, sensor bar 415 is oriented parallel to the X-axis 323, which is orthogonal to the Y-axis 325. The location of sensor bar 415 on Y-axis 325 may be represented by Y1 425. Similarly, sensor bar 420 is oriented parallel to Y-axis 325, which is orthogonal to X-axis 323. The location of sensor bar 420 on X-axis 323 may be represented by X1 430. By touching the touch sensitive screen at position 410, which corresponds to the intersection of sensor bar 415 and sensor bar 420, the object or the finger becomes capacitively coupled to both energized sensor bars, producing a response signal 435 on lead line 445 and a response signal 440 on lead line 450. Both signals are provided to the control circuit 130 (FIG. 1), where they are received and processed by the control circuit 130.

It should be appreciated that only one response signal from each layer is shown for simplicity of illustration. In actual operation, a touch may produce signals of various strengths on multiple sensor bars of a single sensor layer. The control circuit may determine the touch position by taking into account the signals from multiple bars in the immediate neighborhood of the touched bars. A linear or non-linear interpolation of the multiple signals from each layer may be used to accurately determine the touch position.

Figure 5:
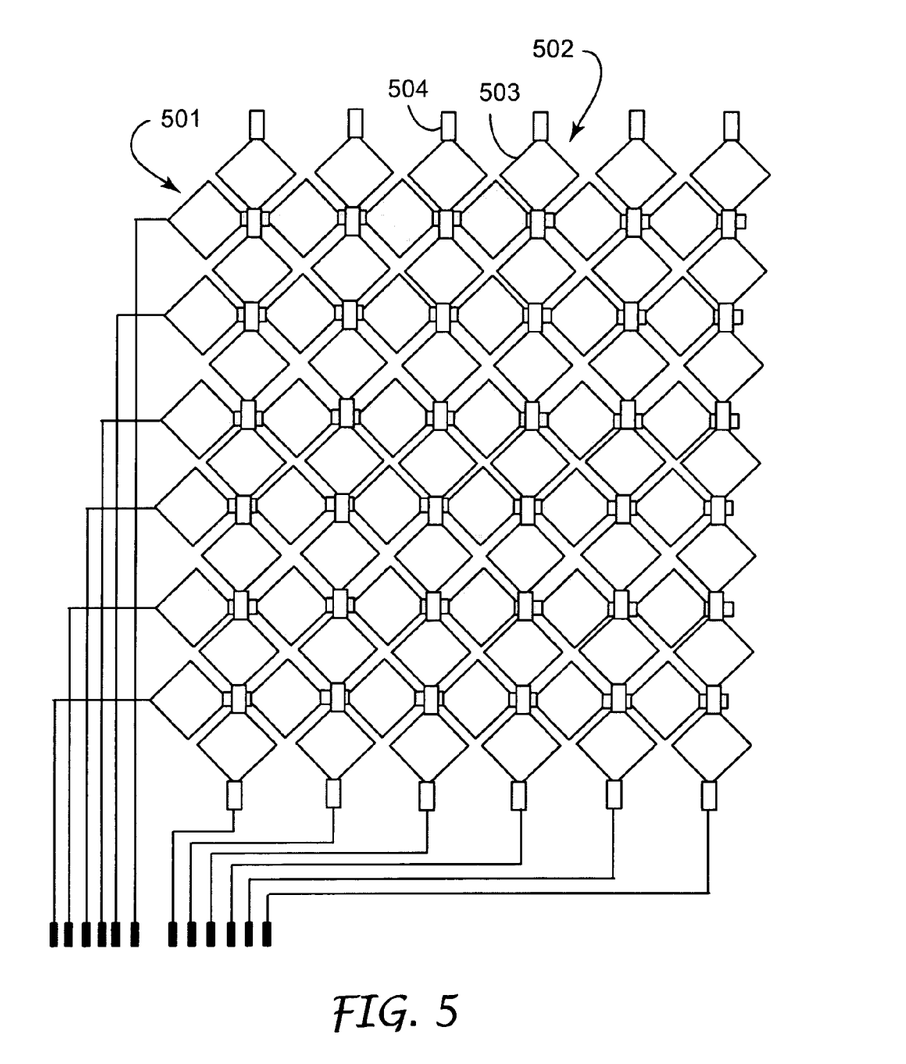
FIG. 5 is a schematic representation of one embodiment of the invention illustrating the conducting elements' pattern.

FIG. 5 is a schematic illustration of another embodiment in which the sensor bars are not rectangular as shown in FIGS. 2 through 4. In this embodiment, there are two sensor layers, a first layer 501 and a second layer 502. Each row of conducting elements (e.g., element 503) of each sensor layer includes a series of diamond-shaped patches that are connected to each other with short pieces of relatively narrow rectangles (e.g., connector 504). One advantage of this sensor geometry is that if both sensing layers are excited simultaneously the top layer (second layer 502) shields the bottom layer (first layer 501) except for the deletion areas between the bars, where the bars of the first layer 501 can be capacitively coupled. In this embodiment, it is possible to have a significant amount of coupling on points on both sensor layers even when both sensor layers are excited simultaneously. It should be mentioned that the patches in the conducting elements may have shapes other than diamond. For example the patches may be hexagons or the like. The size and aspect ratios of the conductive patches may be chosen such that a typical finger would cover at least a portion of a diamond on each layer.

It may be highly desirable to minimize the area occupied on the sides of touch sensors for routing lead lines. There are several possible ways of reducing this area. For instance, the lattice touch sensor envisioned by the present invention may use sensor bars connected to lead lines only at one end. This effectively reduces the lead line routing area around the touch screen. Another example is to connect more than one bar to each lead line, and use signal-processing schemes to distinguish the touched bars. In this embodiment, each lead line is shared by an equal number of bars as the other lead lines. For example, if a lead line in a sensor layer is connected to 3 bars, the other lead lines on that sensor layer are attached to 3 bars. One of the possible methods that may be applied to determine which of the bars, sharing the same lead line, has actually been touched is that reported in co-pending U.S. patent application Ser. No. 09/998,614.

Figure 6:
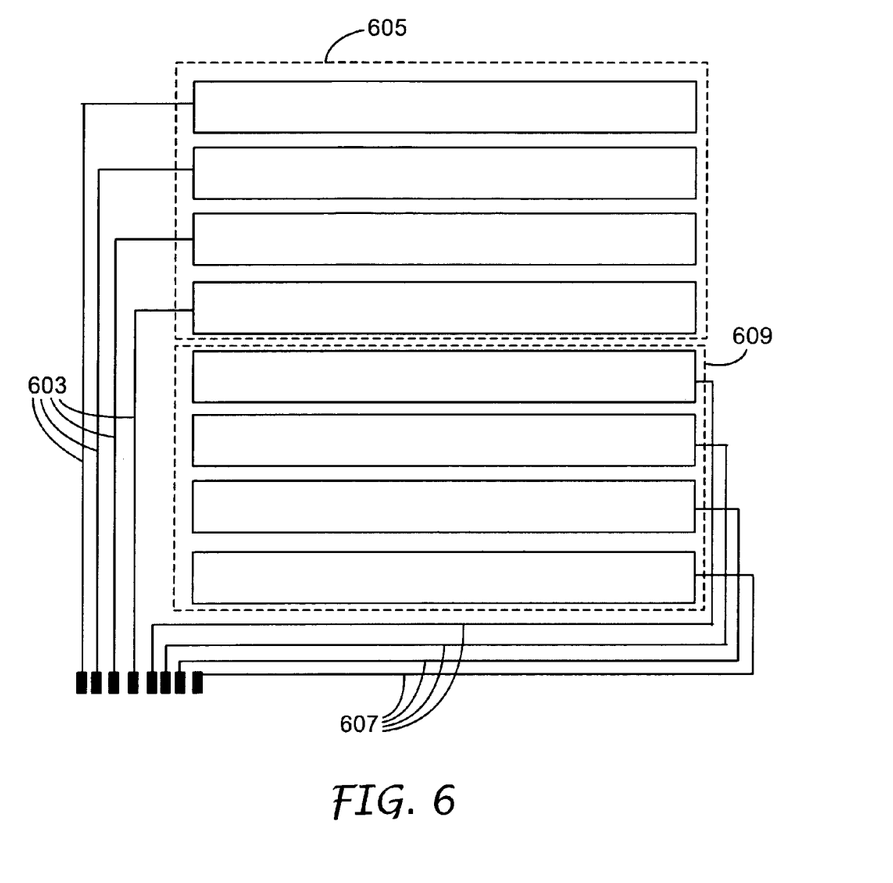
FIG. 6 is a schematic representation of one embodiment of the invention illustrating a lead-line configuration that saves area around the sensor.

FIG. 6 shows an alternative embodiment of the invention that reduces the area around the sensor. A sensor layer is shown in which there are eight bars that are uniquely addressed by their individual lead lines (a discrete design). In this embodiment each sensing layer forms a discrete capacitive touch sensor, such as the one described in co-pending U.S. patent application Ser. No. 10/176,564. A discrete pattern is used in FIG. 6 for simplicity. Other connection schemes may be used without deviating from the spirit of this particular embodiment.

The lead lines on each sensor layer are divided in two groups, each group running along a different edge of the sensor. The first group 603 is connected to Indium Tin Oxide (ITO) bars 605 on the top half of the sensor. This group of lead lines runs along the left edge and goes straight to tail connection pads. The second group 607 is connected to ITO bars 609 in the bottom half of the sensor. The lead lines of this second group 607 are connected to the opposite end of the bars 609 at the right side, and run along the right edge and then along the bottom edge of the sensor to go to their corresponding contact pads. In this embodiment, three edges of the sensor are occupied by the space required for four lead lines. This is half of the space that would have been necessary for a conventional design with eight lead lines on each side of the sensor. The saving on the lead line routing area in this embodiment may be used to minimize the overall size of the sensor, or it could be used to keep the same overall sensor size but increase the active area of the sensor.

In accordance with the invention, the coordinates are determined by finding the bars carrying the peak signal and their immediate neighbors on each layer. One of the advantages of this method is that the accuracy of the coordinates determined is neither dependent on the uniformity of the sheet resistance of the conductive bars, nor is it affected by any possible imbalances caused by the sensor circuit configuration. This eases the stringent uniformity requirement that applies in conventional capacitive touch sensors, and allows the use of less expensive transparent conductive thin films in the sensor element. In other words, if the sensor bars are used to locate a touch in only one direction, the ratio of signal strength on each side is not important. Thus, the resistance uniformity of the sensor bars is much less important, thus simplifying the manufacturing process and reducing the cost of the touch sensor.

In addition, implementations of the present invention are not strongly affected by far field effects. Thus, another advantage of the invention is that simpler control circuits may be used that do not include the elements for countering far field effects. This further lowers the cost of manufacturing such touch screens.

We claim:

1. A device comprising a touch-sensitive screen comprising:
   a touching surface;
   a first sensor layer including:
      a first set of capacitive sensor bars disposed in a first direction, each of the first set of capacitive sensor bars having a first end and a second end, wherein the first end of each of the first set of capacitive sensor bars is connected to one of a first set of lead lines;
   a second sensor layer including:
      a second set of capacitive sensor bars disposed in a second direction, the second direction being substantially orthogonal to the first direction, each of the second set of capacitive sensor bars having a first end and a second end, wherein the first end of each of the second set of capacitive sensor bars is connected to one of a second set of lead lines; and
   a non-conductive layer separating the first sensor layer from the second sensor layer,
      wherein the touch-sensitive screen is mounted within the device, the area around the touch-sensitive screen being sized in accordance with a reduced number of lead lines on the second ends of the sensor bars in the first set of capacitive sensor bars.

2. The device of claim 1, wherein the first set of capacitive sensor bars and the second set of capacitive sensor bars are substantially orthogonal.

3. The device of claim 1, wherein each of the second set of capacitive sensor bars is connected at only one end to one of a second set of lead lines.

4. The device of claim 1, wherein the first set of capacitive sensor bars and the second set of capacitive sensor bars are constructed of indium tin oxide.

5. The device of claim 1, wherein a touch to the touching surface is experienced by a first sensor bar in the first set of capacitive sensor bars and a second sensor bar in the second set of capacitive sensor bars, the position of the touch on the touching surface being determined according to a position of the first sensor bar in the second direction and a position of the second sensor bar in the first direction.

6. The device of claim 1 wherein each of the second ends of the first set of sensor bars are connected to the first set of lead lines, and the second ends of the second set of sensor bars are connected to the second set of lead lines.

7. The device of claim 1, wherein each of the second ends of first set of sensor bars are not connected to the first set of lead lines, and the second ends of the second set of sensor bars are not connected to the second set of lead lines.

8. The device of claim 1, wherein the area around the touch-sensitive screen is sized in additional accordance with a lack of lead lines on the second ends of the sensor bars in the second set of sensor bars.

9. The device of claim 1, wherein the first and second set of capacitive sensor bars each comprises
rows of patches of conductive material and depletion areas between the patches of conductive material,
the rows of the first and second sets of sensor bars being configured such that the patches of the first set of sensor bars are disposed within the depletion areas of the second set of sensor bars, and the patches of the second set of sensor bars are disposed with the depletion areas of the first set of sensor bars.

10. The device of claim 9, wherein the patches of conductive material of the first and second sets of sensor bars are configured in a substantially diamond shape.

11. The device of claim 9, wherein, on each set of sensor bars, the patches of conductive material are connected with strips of conductive material.

12. A method for identifying a location of a touch on a touch-sensitive screen, comprising: receiving a first signal and a second signal, the first signal being associated with a first sensor bar on the touch-sensitive screen, the second signal being associated with a second sensor bar on the touch-sensitive screen, the first and second sensor bars being disposed in two different layers of sensor bars, the sensor bars of the two different layers extending in two different directions, and being connected to lead lines at a first end of the sensor bars; analyzing the first signal and the second signal to identify the first sensor bar and the second sensor bar, wherein the first sensor bar has a corresponding position, and the second sensor bar has a corresponding position; analyzing secondary signals on one or more sensor bars neighboring the first sensor bar or the second sensor bar; and locating the touch through analysis of the position of the first sensor bar and the second sensor bar, and further refinement through analysis of the secondary signals; and wherein the touch-sensitive screen is mounted within a device, the area around the touch-sensitive screen being sized in accordance with a reduced number of lead lines on the second ends of the sensor bars in the first set of capacitive sensor bars.

13. The method as in claim 12, wherein the sensor bars of the two different layers are further connected at a second end of the sensor bar.

14. The method as in claim 12, wherein the sensor bars of the two different layers are connected at only the first end of the sensor bar.

15. The method of claim 12, further comprising generating a set of coordinates corresponding to the location of the touch and providing the coordinates to a computing device for further processing.

16. The method of claim 12, wherein the two different directions comprise substantially orthogonal directions.

17. The method of claim 12, wherein the first sensor bar is one of a plurality of sensor bars in a first layer of sensor bars, and the second sensor bar is one of another plurality of sensor bars in a second layer of sensor bars, the first and second layers of sensor bars being separated by a dielectric material.

18. The method of claim 17, wherein the first end of each of the sensor bars in the first layer of sensor bars is connected to at least one of a plurality of lead lines, and the first end each of the sensor bars in the second layer of sensor bars is connected to at least one of the plurality of lead lines.

19. The method of claim 17, wherein the first ends of at least two of the sensor bars of the sensor layers are connected to the same lead line and a signal-processing scheme is used to distinguish which of the jointly-connected sensor bars experienced the touch.

20. The method of claim 19, wherein the first ends of at least two of the sensor bars in the other sensor layer are connected to the same lead line and a signal-processing scheme is used to distinguish which of the jointly-connected sensor bars experienced the touch.

21. The method of claim 12, wherein analyzing the first and second signals comprises identifying a first coordinate in a first direction corresponding to the first sensor bar and identifying a second coordinate in a second direction corresponding to the second sensor bar, the first and second directions being about orthogonal in the plane of the touch-sensitive screen.

22. The method of claim 21, wherein analysis of the position of the first sensor bar and the second sensor bar comprises evaluating the location identified by the first coordinate in the first direction and the second coordinate in the second direction.

* * * * *